(12) United States Patent
Best et al.

(10) Patent No.: US 11,996,167 B2
(45) Date of Patent: May 28, 2024

(54) GENERATING RANDOM ADDRESSES FOR NONVOLATILE STORAGE OF SENSITIVE DATA

(71) Applicant: Cryptography Research, Inc., San Jose, CA (US)

(72) Inventors: Scott C. Best, Palo Alto, CA (US); Mark Evan Marson, Carlsbad, CA (US); Joel Wittenauer, Pleasanton, CA (US)

(73) Assignee: Rambus Inc., San Jose, CA (US)

( * ) Notice: Subject to any disclaimer, the term of this patent is extended or adjusted under 35 U.S.C. 154(b) by 160 days.

(21) Appl. No.: 17/636,982

(22) PCT Filed: Aug. 14, 2020

(86) PCT No.: PCT/US2020/046356
§ 371 (c)(1),
(2) Date: Feb. 21, 2022

(87) PCT Pub. No.: WO2021/014054
PCT Pub. Date: Mar. 4, 2021

(65) Prior Publication Data
US 2022/0293152 A1 Sep. 15, 2022

Related U.S. Application Data

(60) Provisional application No. 62/894,716, filed on Aug. 31, 2019.

(51) Int. Cl.
*G11C 8/16* (2006.01)
*G06F 7/58* (2006.01)
(Continued)

(52) U.S. Cl.
CPC .............. *G11C 8/16* (2013.01); *G06F 7/58* (2013.01); *G11C 8/12* (2013.01); *G11C 8/20* (2013.01); *G11C 13/0035* (2013.01)

(58) Field of Classification Search
CPC ......... G11C 8/16; G11C 8/12; G11C 13/0035; G11C 8/20; G11C 16/08; G11C 16/22; G06F 7/58
See application file for complete search history.

(56) References Cited

U.S. PATENT DOCUMENTS 8,195,957 B2   6/2012   Dolgunov et al.
9,916,261 B2   3/2018   Gammel et al.
(Continued)

FOREIGN PATENT DOCUMENTS

AU   2017245300 B2   11/2017

OTHER PUBLICATIONS

EP Extended European Search Report with dated Jul. 28, 2023 re: EP Appln. No. 20857978.9. 9 pages.
(Continued)

*Primary Examiner* — Donald H B Braswell
(74) *Attorney, Agent, or Firm* — The Neudeck Law Firm, LLC

(57) ABSTRACT

A random number generator selects addresses while a 'scoreboard' bank of registers (or bits) tracks which addresses have already been output (e.g., for storing or retrieval of a portion of the data.) When the scoreboard detects an address has already been output, a second address which has not been used yet is output rather than the randomly selected one. The second address may be selected from nearby addresses that have not already been output.

14 Claims, 8 Drawing Sheets

(51) Int. Cl.
*G11C 8/12* (2006.01)
*G11C 8/20* (2006.01)
*G11C 13/00* (2006.01)

(56) References Cited

U.S. PATENT DOCUMENTS

| | | | |
|---|---|---|---|
| 2013/0282967 A1* | 10/2013 | Ramanujan | G06F 12/0246 |
| | | | 711/114 |
| 2014/0052922 A1* | 2/2014 | Moyer | G06F 12/0864 |
| | | | 711/128 |
| 2014/0254233 A1 | 9/2014 | Sandri et al. | |
| 2015/0081853 A1 | 3/2015 | Nicholson et al. | |
| 2015/0379430 A1 | 12/2015 | Dirac et al. | |
| 2016/0171252 A1* | 6/2016 | Leiserson | G09C 1/00 |
| | | | 713/193 |
| 2019/0079861 A1* | 3/2019 | Amaki | G11C 29/42 |

OTHER PUBLICATIONS

Notification of Transmittal of the International Search Report and the Written Opinion of the International Searching Authority, or the Declaration with dated Jan. 26, 2021 re: Int'l Appln. No. PCT/US2020/046356. 16 pages.

\* cited by examiner

GENERATING RANDOM ADDRESSES FOR NONVOLATILE STORAGE OF SENSITIVE DATA

DETAILED DESCRIPTION OF THE EMBODIMENTS

Certain secret or sensitive data (e.g., a cryptographic key, or a portion of a cryptographic key) may be stored in a chip within that chip's nonvolatile memory ("NVM"). Typically, this data is stored in linear order where the first portion (e.g., word, byte, nibble, etc.) of secret data is stored in the first memory location, the second in the second memory location, and so on. And when the data is accessed, it is also usually accessed in linear order (i.e., where the first memory location is read, followed by the second, etc.) This traditional linear access approach allows an adversary to recover the secret data by invasively monitoring the data signals between the security core requesting the data and the NVM circuitry. In such an attack, the adversary need not monitor the address lines, but instead can infer the addresses corresponding to the data they recover. By allowing the adversary to recover the secret data by only monitoring the data lines, the adversary's effort during an invasive attack is greatly simplified, as the number of data lines is often significantly smaller than the number of address lines (e.g., a NVM circuit might use 16 address lines, but only have a 4-bit output bus).

In an embodiment, a random number generator is used during generation of the access pattern of addresses, while a 'scoreboard' bank of registers (or bits) tracks which addresses have already been used (e.g., for storing or retrieval of a portion of the data.) When the scoreboard detects an address has already been used, a second address which has not been used yet is used rather than the randomly selected one. The second address may be selected from nearby addresses that have not already been output. In this way, an adversary who is monitoring the data lines while the security core is accessing a block of secret data will not be able to correctly piece together the overall secret data, as the portions are being accessed in random order. At the same time, the scoreboard approach insures that the security core can obtain the block of secret data in the minimum required time.

Figure 1:
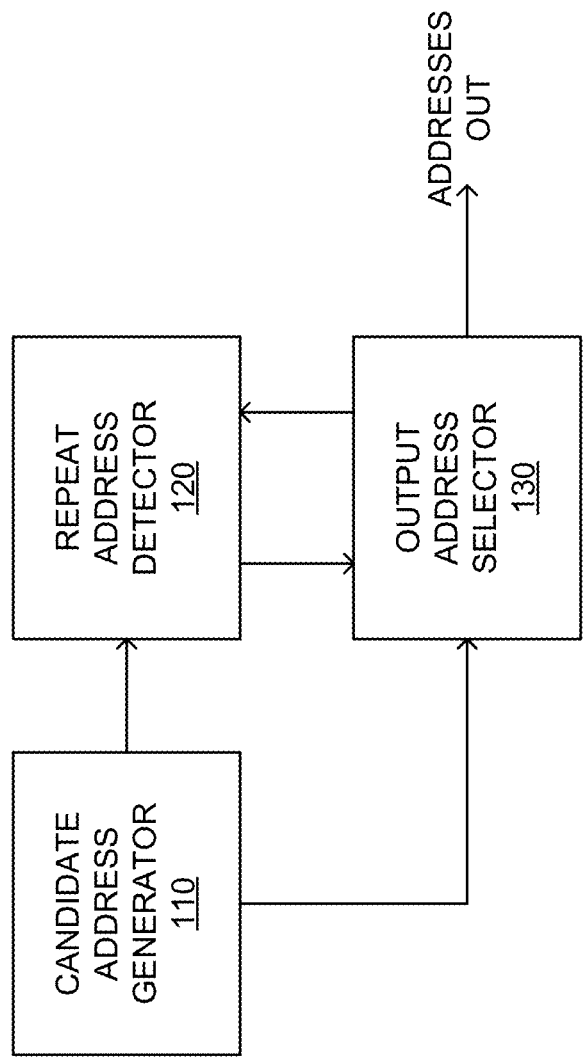
FIG. 1 is a block diagram illustrating address generation logic.

FIG. 1 is a block diagram illustrating address generation logic. In FIG. 1, address generation system 100 comprises candidate address generator 110, repeat address detector 120, and output address selector 130. Candidate address generator 110 is operatively coupled to output address selector 130 and repeat address detector 120. Repeat address detector 120 is operatively coupled to output address selector 130. Output address selector 130 provides addresses to be output by address generation system 100.

In an embodiment, candidate address generator 110 provides candidate addresses to repeat address detector 120 and output address selector 130. Repeat address detector 120 determines whether a given candidate address has already been provided by the address generation system 100 (e.g., provided to an arbiter circuit responsible for reading data from the NVM circuitry). Repeat address detector 120 may determine whether a given candidate address has already been output by address generation system 100 before the entire set (or range) of addresses has been output in order to prevent repeat addresses from being output until the entire set (or range) of addresses has been output. In this manner, the entire set (or range) of addresses are output in a known (i.e., fixed) number of transactions/cycles/etc.

For example, in order to retrieve/store a burst of data consisting of 64 bytes (or words, or nibbles, etc.), address generation system 100 may be configured to output addresses that range from 0 to 63. Because repeat addresses from this range are prevented from being output until the entire range (i.e., burst/block) has been output, address generation system 100 will output 64 addresses before allowing a repeat address to be output. In other words, address generation system 100 will output each of the 64 addresses exactly once while retrieving/storing the given 64 byte block of data.

In an embodiment, candidate address generator 110 outputs candidate addresses based on a random or pseudo-randomly generated number (collectively hereinafter referred to as a random, randomized, or randomly selected number.) Repeat address detector 120 determines whether each respective randomly selected candidate address, from the set or range of addresses, has already been output while retrieving/storing the current block. If a given candidate address is determined not to have already been output during the current burst, output address selector 130, selects the candidate address provided by candidate address generator 110 to be output by address generation system 100. If a given candidate address is determined to have already been output during the current burst, output address selector 130, based on information from repeat address detector 120, selects an address that has not already been output during the current burst.

In an embodiment, when a given candidate address is determined to have already been output during the current burst, output address selector 130 may select the next lower value (when compared to the candidate) address that has not already been output during the current burst. If there are no lower value addresses that have not already been output, output address selector 130 may select the next higher value (when compared to the candidate) address that has not already been output during the current burst. Similarly, in another embodiment, when a given candidate address is determined to have already been output during the current burst output address selector 130 may select the next higher value (when compared to the candidate) address that has not already been output during the current burst. If there are no higher value addresses that have not already been output, output address selector 130 may select the next lower value (when compared to the candidate) address that has not already been output during the current burst.

In another embodiment, when a given candidate address is determined to have already been output during the current burst output address selector 130 may select, based on a random number, whether to select the next lower or higher value address that has not already been output during the current burst. When the next higher value address is selected based on the random number, and there are no higher value addresses that have not already been output, output address selector 130 may select the next lower value address (when compared to the candidate) that has not already been output during the current burst. Likewise, when the next lower value address is selected based on the random number, and there are no lower value addresses that have not already been output, output address selector 130 may select the next higher value address (when compared to the candidate) that has not already been output during the current burst.

Figure 2:
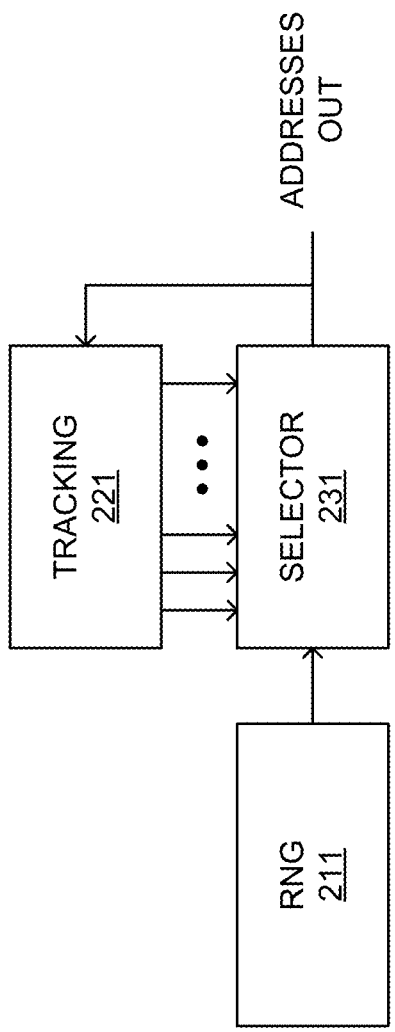
FIG. 2 is a block diagram illustrating a fixed time address generation block.

FIG. 2 is a block diagram illustrating a fixed time address generation block. In FIG. 2, address generation system 200 comprises random number generator 211, address selector 231, and used address tracking 221. Random number generator 211 is operatively coupled to address selector 231. Random number generator 211 is operatively coupled to address selector 231 to provide at least a random number that selector 231 uses at least in part to select at least one address to be output by address generation system 200.

Address tracking 221 is operatively coupled to selector 231. Address tracking 221 is operatively coupled to selector 231 to provide selector 231 with information regarding which addresses from a set (or range) of addresses have been, or have not been, output. In a given output cycle, selector 231 provides the address to be output by address generation system 200 based at least on the random number provided by random number generator 211, and the information from address tracking 221. The address output by address generation system 200 is fed back to address tracking 221 to be indicated as having been used.

In an embodiment, random number generator 211 provides a random number to selector 231. This random number may comprise a candidate address. This random number may comprise an index to a candidate address (e.g., an index into a table of not yet used addresses). Selector 231, based at least in part on the information from tracking 221, determines whether the candidate address has already been output by address generation system 200. Selector 231 may determine whether a given candidate address has already been output in order to prevent repeat addresses from being output until the entire set (or range) of addresses has been output. In this manner, the entire set (or range) of addresses are output in a known (i.e., fixed) number of transactions/cycles/etc.

For example, in order to retrieve/store a burst of data consisting of 64 bytes (or words, or nibbles, etc.), random number generator 211 may be configured to output candidate addresses that range from 0 to 63. Because random number generator 211 outputs a substantially (or effectively) random sequence of candidate addresses, it is possible for random number generator 211 to output one or more repeat addresses from the range before all of the numbers in the range have been output. When a repeat candidate address occurs, selector 231 uses the information from address tracking 221 to detect this occurrence. Selector 231 then prevents this reoccurring address from being output and selects (also based on the information from tracking 221) a new address to be output that has not yet been output. In this manner, address generation system 200 will output each of the 64 addresses exactly once while retrieving/storing the given 64 byte block of data.

In an embodiment, random number generator 211 outputs a sequence of random or pseudo-randomly generated numbers. Each number in the sequence may comprise a candidate address (e.g., a subset of the bits output by random number generator 211 may be used as a candidate address and the rest may be used by selector 231 for other purposes.) Selector 231 determines, based on the information from tracking 221, whether each respective randomly generated candidate address has already been output while retrieving/storing the current block. If a given candidate address is determined not to have already been output during the current burst, selector 231 selects the candidate address provided by random number generator 211 to be output by address generation system 200. If a given candidate address is determined to have already been output during the current burst, selector 231, based at least on information from tracking 221, selects an address that has not already been output during the current burst.

In an embodiment, when a given candidate address is determined to have already been output during the current burst, selector 231 may select, based on the information from tracking 221, the next lower value (when compared to the candidate) address that has not already been output during the current burst. If there are no lower value addresses that have not already been output, selector 231 may select, based on the information from tracking 221, the next higher value (when compared to the candidate) address that has not already been output during the current burst. Conversely, in another embodiment, when a given candidate address is determined to have already been output during the current burst output, selector 231 may select, based on the information from tracking 221, the next higher value (when compared to the candidate) address that has not already been output during the current burst. If there are no higher value addresses that have not already been output, selector 231 may select, based on the information from tracking 221, the next lower value (when compared to the candidate) address that has not already been output during the current burst.

In another embodiment, when a given candidate address is determined to have already been output during the current burst, selector 231 may select, based on the information from tracking 221 and based on a random number (e.g., one or more bits in the random number received from random number generator 211 that were not used as the candidate address), whether to select the next lower or higher value address that has not already been output during the current burst. When the next higher value address is selected based on the random number, and there are no higher value addresses that have not already been output, selector 231 may select, based on the information from tracking 221, the next lower value address (when compared to the candidate) that has not already been output during the current burst. Likewise, when the next lower value address is selected based on the random number, and there are no lower value addresses that have not already been output, selector 231 may select, based on the information from tracking 221, the next higher value address (when compared to the candidate) that has not already been output during the current burst.

Figure 3A:
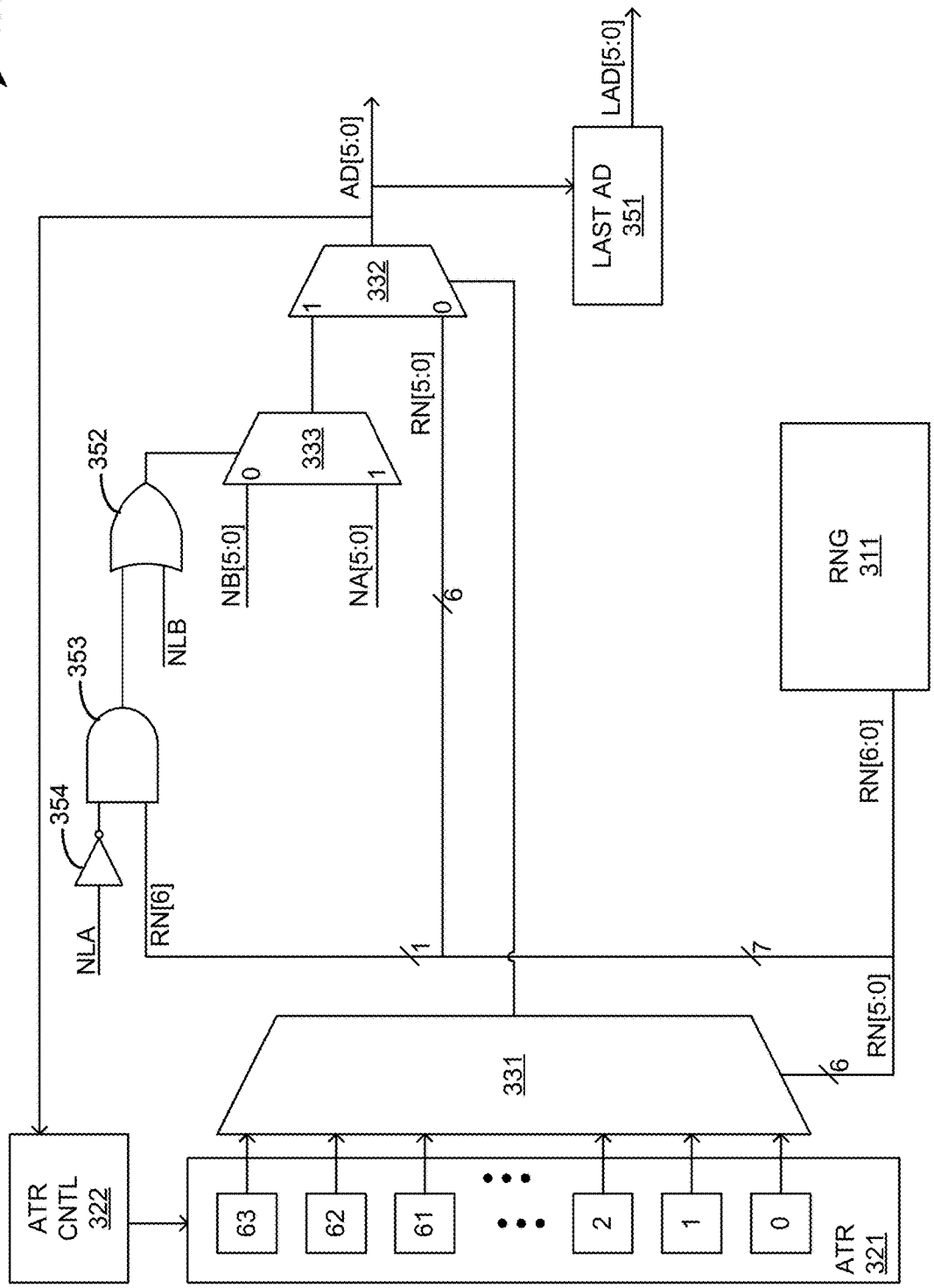
FIGS. 3A and 3B illustrate an example fixed time address generation logic.
Figure 3B:
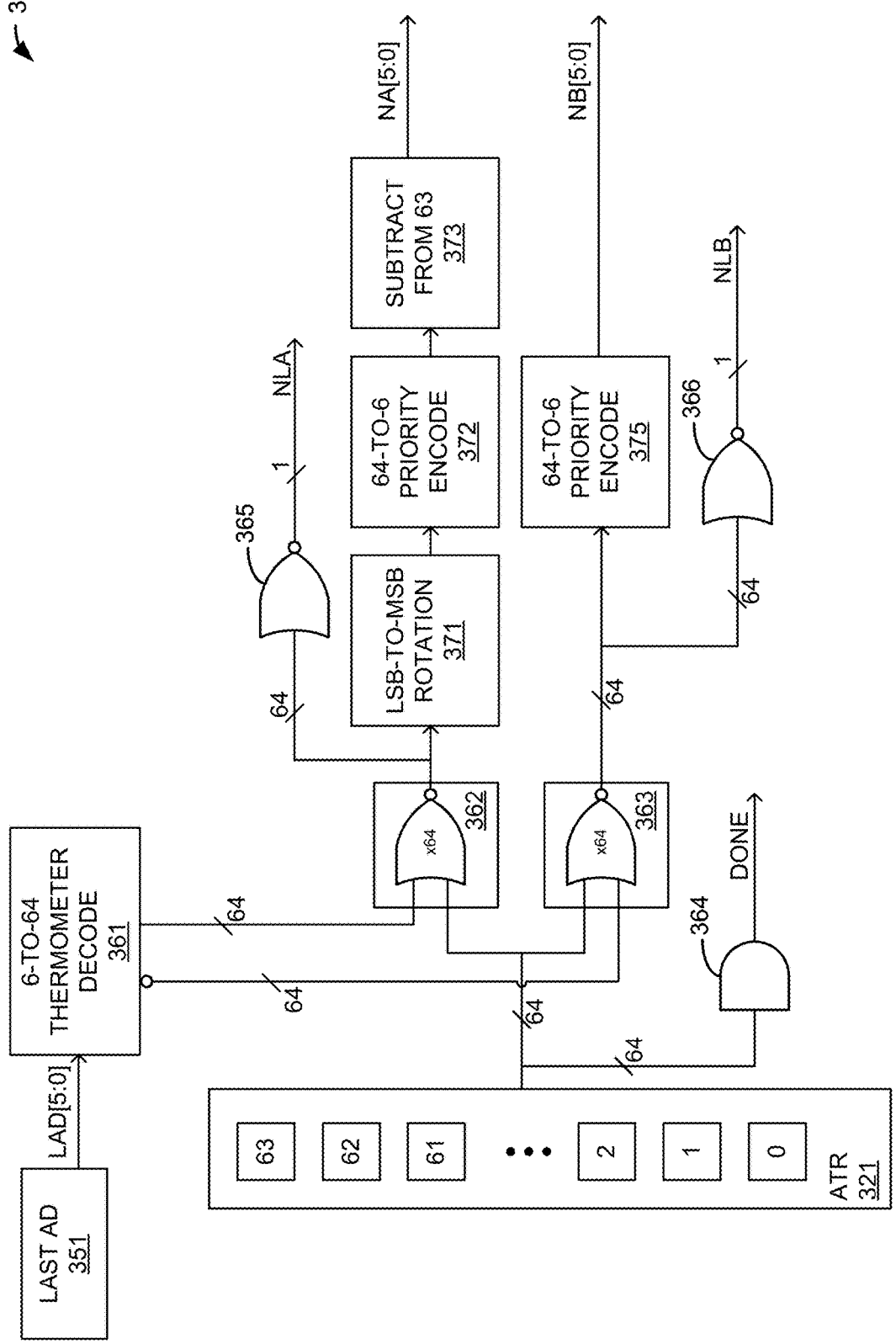

FIGS. 3A and 3B illustrate an example fixed time address generation logic. FIG. 3A illustrates an example circuit to generate the next address. In FIG. 3A, next address generator 301 comprises random number generator (RNG) 311, 64-bit address tracking register 321 (a.k.a, the "ATR" or "scoreboard"), address tracking control 322, 64:1 multiplexor (MUX) 331, 12:6 MUX 332, 12:6 MUX 333, 6-bit last address register 351, 2-input OR gate 352, 2-input AND gate 353, and INV gate 354. Note that in this embodiment, the ATR 321 is shown as being a "linear" register, which starts at address 0 and ends at address 63. In other embodiments, the ATR can be organized in "circular" fashion, such that the incremental address above 63 is address 0, and the incremental address below 0 is 63.

In an embodiment, address generator 301 selects the next address to be output. For example, RNG 311 outputs a 7-bit value RN[6:0]. The lower 6-bits RN[5:0] are effectively tested as a "candidate address" by MUX 331. If the access tracking register 321 bit associated with the candidate address is empty (e.g., the value is a "0" at the position corresponding to the 6-bit RN[5:0] value), then that candidate address RN[5:0] is selected by MUX 332 to be output as the next-address. After RN[5:0] is provided as an output, ATR control 322 updates (e.g., from a 0 to a 1) the corresponding location in ATR 321. In addition, last address register 351 value is also updated. This value is used by repeated address resolver 302 described herein with reference to FIG. 3B. Note that ATR control 322 will at first reset the contents of ATR 321 (e.g., to contain all "0"s in all positions) at the start of a retrieval/storage transaction.

When the bit in access tracking register 321 corresponding to RN[5:0] indicates the logical value is a '1', (meaning the value of RN[5:0] has already been used/output) then MUX 332 selects a different address. Based at least in part on RN[7], MUX 333 selects either the "next above" address NA[5:0] (i.e., the next empty address location with an address value larger than the last-used register value LAD[5:0]), or the "next below" address NB[5:0] (i.e., the next empty address location with an address value smaller than the last-used register value).

When ATR 321 indicates there are no unused values above (i.e., "nothing left above" signal NLA a logical '1') or below (i.e., "nothing left below" signal NLB a logical '1'), the logic function formed by OR gate 352, AND gate 353, and inverter 354 select the next value below or the next value above, respectively. In other words, when the random bit RN[7] indicates the "next above" address NA[5:0] should be used, but there are no "next above" addresses left unused, address generator 301 outputs the "next below" address NB[5:0]. When the random bit RN[7] indicates the "next below" address NB[5:0] should be used, but there are no "next below" addresses left unused, address generator 301 outputs the "next above" address NB[5:0].

FIG. 3B illustrates an example circuit to provide at least one unused address when the random number indicates and address that has already been output. In FIG. 3B, repeated address resolver 302 comprises address tracking register 321 (same element as FIG. 3A), last address register 351 (same element as FIG. 3A), 6-bit to 64-bit thermometer decoder 361, 64 2-input NOR gates 362, 64 2-input NOR gates 363, 64-input AND gate 364, 64-input NOR gate 365, 64-input NOR gate 366, least significant bit (LSB) to most significant bit (MSB) rotator 371, 64-bit to 6-bit priority encoder 372, subtractor 373, and 64-bit to 6-bit priority encoder 372.

The last-used address value LAD[5:0] is recoded by decoder 361 into a 64-bit thermometer code value. For example, if the LAD[5:0] value was "13" then the resulting 64-bit output would have 51 leading zeros (from the MSB down to bit 14) followed by 13 ones (from bit 13 down to the LSB). When this 64-bit vector (and its inverse) is NOR'd with the 64-bit value contained within the bits of ATR 321, the resulting vectors can be used to determine the "next above" NA[5:0] and "next below" NB[5:0] values.

The 64-bit thermometer coded value output by decoder 361 is NOR'd by NOR gates 362 with the corresponding bit values from access tracking register 321. The order of the outputs of NOR gates 362 reversed order-wise by LSB-to-MSB rotation 371. The output of LSB-to-MSB rotation 371 is input to priority encoder 372. The output of priority encoder 372 indicates how many address steps from 63 (i.e., the maximum possible address value NA[5:0]=111111b) the "next above" address is. The output of priority encoder 372 is subtracted from 63 by subtractor 373 to produce the next-above address NA[5:0]. If the outputs of all of the NOR gates 362 are zero, it indicates that there are no unused addresses above the last used value LAD[5:0]. To detect this, a 64-input NOR gate 365 receives the outputs of NOR gates 362 to determine a "nothing left above" (NLA) signal. In some embodiment, NOR gate 365 may be implemented as several stages of gates—e.g., NOR gates, OR gates, etc.

An inverted thermometer value output by decoder 361 is NOR'd by NOR gates 363 with the corresponding bit values from access tracking register 321. The outputs of NOR gates 363 are input to priority encoder 372 to determine the "next below" address NB[5:0]. If the outputs of all of the NOR gates 363 are zero, it indicates that there are no unused addresses below the last used value LAD[5:0]. To detect this, a 64-input NOR gate 366 receives the outputs of NOR gates 363 to determine a "nothing left below" (NLB) signal. The "next above" NA[5:0], "next below" NB[5:0], "nothing left above" NLA, and "nothing left below" values/signals are provided to address generator 301 as illustrated in FIG. 3A. Finally, for purpose of detecting completion (i.e., that all of address values in the range have been output), AND gate 354 detects when every ATR value is a logical "1" and asserts a "done" signal as a result.

Figure 4:
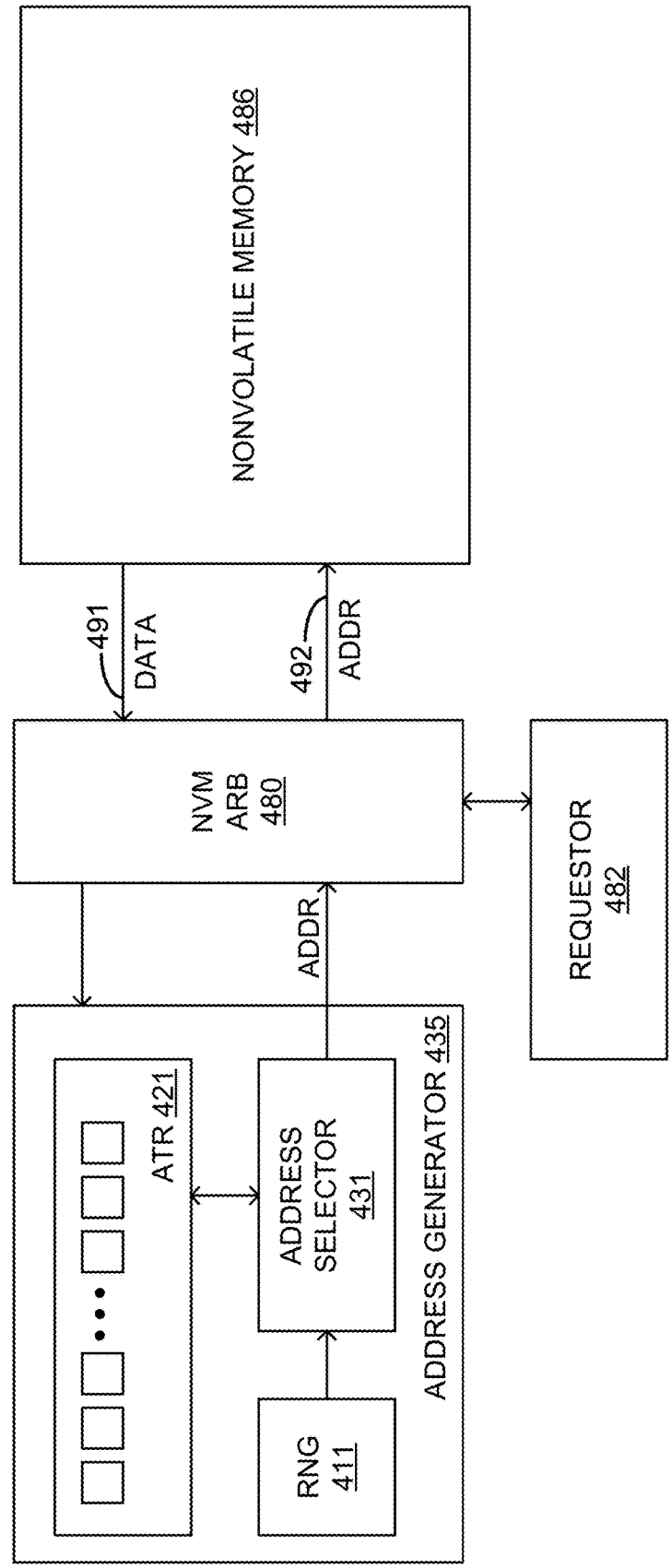
FIG. 4 illustrates a system that accesses data in a randomized order.

FIG. 4 illustrates a system that accesses data in a randomized order. In FIG. 4, data access system 400 comprises address generator 435, nonvolatile memory arbiter/controller 480, nonvolatile memory 486, and data requestor 482. Address generator 435 includes address tracking register 421, random number generator 411, and address selector 431. Address generator is operatively coupled to nonvolatile memory arbiter 480. Data requestor is operatively coupled to nonvolatile memory arbiter 480. Nonvolatile memory arbiter 480 is operatively coupled to nonvolatile memory 486 via at least an address bus 492 and a read data bus 491. Address generator 435 may be, or comprise, address generation system 100, address generation system 200, and/or address generations system 301,302.

In an example operation, a data requestor 482 (e.g., a security processor and/or security core, etc.) issues a request to nonvolatile memory arbiter 480 to deliver a block of secret data value stored within a nonvolatile memory 486. In this example, the secret data is spread across 64 address locations (e.g., a 256-bit secret key value is stored as 64 nibbles of 4-bit data). NVM arbiter 480 circuit uses address generator 435 to provide the 64 unique addresses in a randomly generated order. NVM arbiter 480 sends the unique addresses in the randomly generated order via address bus 492 to address NVM memory 486 in order to read the secret data. The data is transferred between NVM memory 486 and NVM arbiter 480 via read data bus 491. Thus, because the unique addresses are sent in the randomly generated order, an adversary trying to learn the secret data would need to monitor address bus 492 in addition to monitoring data bus 491.

Address generator 435, as described herein, uses both a random number generator 411 as well as a "scoreboard" address tracking register 421. In this example, ATR 421 holds 64 1-bit values corresponding to addresses that have/have not already been used.

Figure 5:
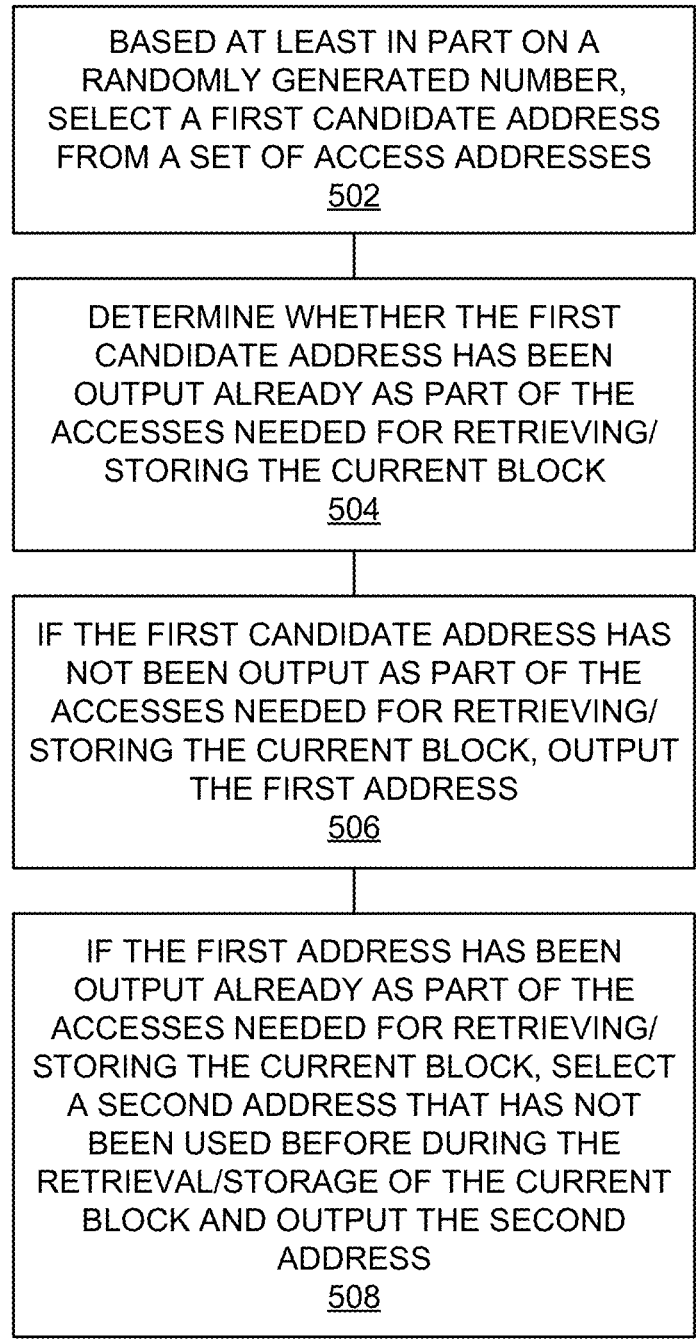
FIG. 5 is a flowchart illustrating a method of generating addresses.

FIG. 5 is a flowchart illustrating a method of generating addresses. The steps illustrated in FIG. 5 may be performed by one or more of address generation system 100, address generation system 200, and/or address generations system 301,302, system 400, and/or their components. Based at least in part on a randomly generated number, a first candidate address is selected from a set of access addresses (502). For example, in order to retrieve/store a block of data consisting of 64 bytes (or words, or nibbles, etc.), random number generator 211 may be configured to output candidate addresses that range from 0 to 63.

It is determined whether the first candidate address has been output already as part of the accesses needed for retrieving/storing the current block (504). For example, based on information received from address tracking 221, selector 231 determines whether the randomly generated candidate address has been output already as part of retrieving/storing the current block. If the first address has not been output before as part of retrieving/storing the current block, the first address is output (506). For example, if the candidate address is determined not to have already been output while retrieving/storing the current block, selector 231 selects the candidate address as provided by random number generator 211 to be output.

If the first address has been output already as part of the accesses needed for retrieving/storing the current block, a second address that has not been used before during the retrieval/storage of the current block is selected and the second address is output (508). For example, if the candidate address is determined to have already been output while retrieving/storing the current block, selector 231, based at least on information from tracking 221, selects an address that has not already been output while retrieving/storing the current block.

For example, when the candidate address is determined to have already been output while retrieving/storing the current block, selector 231 may select, based on the information from tracking 221, the next lower value (when compared to the candidate) address that has not already been output while retrieving/storing the current block. If there are no lower value addresses that have not already been output, selector 231 may select, based on the information from tracking 221, the next higher value (when compared to the candidate) address that has not already been output while retrieving/storing the current block.

In another example, when the candidate address is determined to have already been output during while retrieving/storing the current block, selector 231 may select, based on the information from tracking 221, the next higher value (when compared to the candidate) address that has not already been output while retrieving/storing the current block. If there are no higher value addresses that have not already been output, selector 231 may select, based on the information from tracking 221, the next lower value (when compared to the candidate) address that has not already been output while retrieving/storing the current block.

In another example, when the candidate address is determined to have already been output while retrieving/storing the current block, selector 231 may select, based on the information from tracking 221 and based on a random number (e.g., one or more non-candidate address bits in the random number received from random number generator 211), whether to select the next lower or next higher value address that has not already been output while retrieving/storing the current block. When the next higher value address is selected based on the random number, and there are no higher value addresses that have not already been output, selector 231 may select, based on the information from tracking 221, the next lower value address (when compared to the candidate) that has not already been output while retrieving/storing the current block. Likewise, when the next lower value address is selected based on the random number, and there are no lower value addresses that have not already been output, selector 231 may select, based on the information from tracking 221, the next higher value address (when compared to the candidate) that has not already been output while retrieving/storing the current block.

Figure 6:
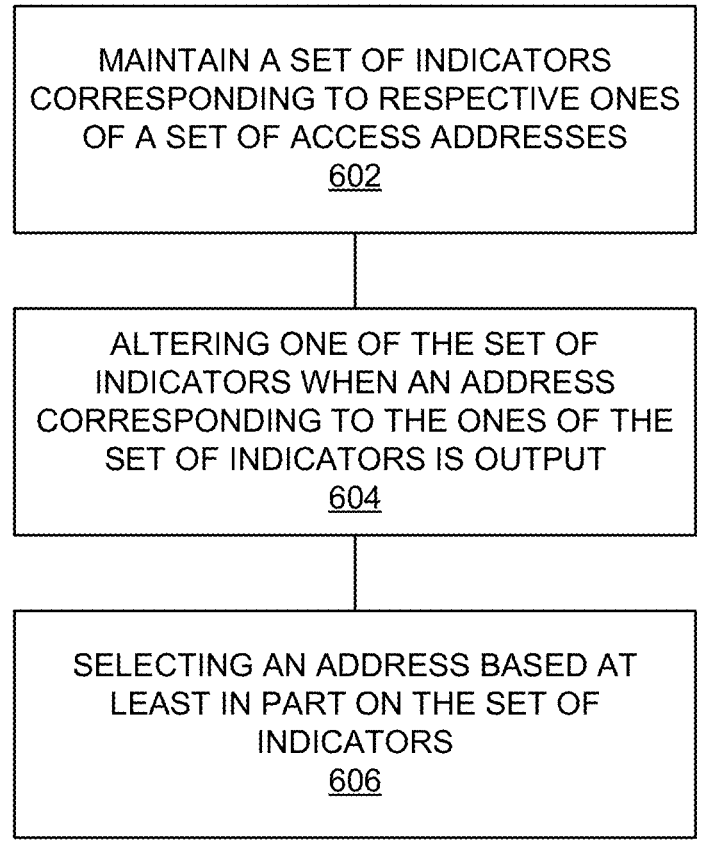
FIG. 6 is a flowchart illustrating a method of selecting addresses.

FIG. 6 is a flowchart illustrating a method of selecting addresses. The steps illustrated in FIG. 6 may be performed by one or more of address generation system 100, address generation system 200, and/or address generations system 301,302, system 400, and/or their components. A set of indicators are maintained corresponding to respective ones of a set of access addresses (602). For example, address tracking 221 may maintain a register (or multiple registers) whose output(s) indicate whether a corresponding address has already been output while retrieving/storing a block of data.

One of the set of indicators is altered when an address corresponding to the ones of the set of indicators is output (604). For example, address tracking 221 may alter the output of the register (or multiple registers) whose output(s) indicates whether a corresponding address has already been output while retrieving/storing a block of data may be altered when the corresponding address is output.

An address is selected based at least in part on the set of indicators (606). For example, when a repeat address occurs, selector 231 may use the information from address tracking 221 to detect this occurrence. Selector 231 may then prevent this reoccurring address from being output and select (also based on the information from tracking 221) a new address to be output that has not yet been output. In this way, the access pattern to the block of data is different each time the data is accessed, but the amount of time needed to access the whole block is constant.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of address generation system 100, address generation system 200, and/or address generations system 301,302, system 400, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 7:
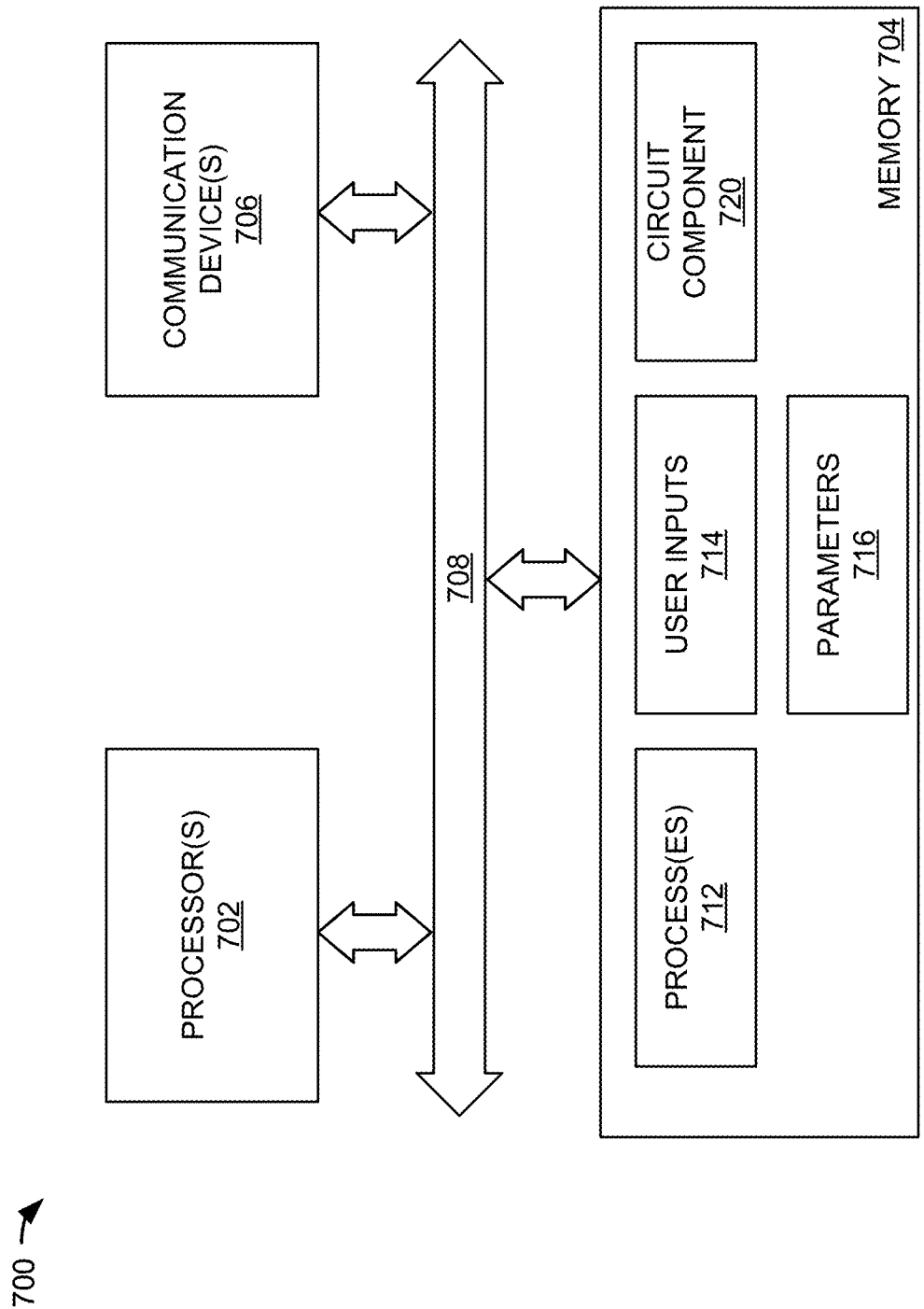
FIG. 7 is a block diagram of a processing system.

FIG. 7 is a block diagram illustrating one embodiment of a processing system 700 for including, processing, or generating, a representation of a circuit component 720. Processing system 700 includes one or more processors 702, a memory 704, and one or more communications devices 706. Processors 702, memory 704, and communications devices 706 communicate using any suitable type, number, and/or configuration of wired and/or wireless connections 708.

Processors 702 execute instructions of one or more processes 712 stored in a memory 704 to process and/or generate circuit component 720 responsive to user inputs 714 and parameters 716. Processes 712 may be any suitable electronic design automation (EDA) tool or portion thereof used to design, simulate, analyze, and/or verify electronic circuitry and/or generate photomasks for electronic circuitry. Representation 720 includes data that describes all or portions of address generation system 100, address generation system 200, and/or address generations system 301,302, system 400 and their components, as shown in the Figures.

Representation 720 may include one or more of behavioral, register transfer, logic component, transistor, and layout geometry-level descriptions. Moreover, representation 720 may be stored on storage media or communicated by carrier waves.

Data formats in which representation 720 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 714 may comprise input parameters from a keyboard, mouse, voice recognition interface, microphone and speakers, graphical display, touch screen, or other type of user interface device. This user interface may be distributed among multiple interface devices. Parameters 716 may include specifications and/or characteristics that are input to help define representation 720. For example, parameters 716 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 704 includes any suitable type, number, and/or configuration of non-transitory computer-readable storage media that stores processes 712, user inputs 714, parameters 716, and circuit component 720.

Communications devices 706 include any suitable type, number, and/or configuration of wired and/or wireless devices that transmit information from processing system 700 to another processing or storage system (not shown) and/or receive information from another processing or storage system (not shown). For example, communications devices 706 may transmit circuit component 720 to another system. Communications devices 706 may receive processes 712, user inputs 714, parameters 716, and/or circuit component 720 and cause processes 712, user inputs 714, parameters 716, and/or circuit component 720 to be stored in memory 704.

Implementations discussed herein include, but are not limited to, the following examples:

Example 1: An address generation circuit, comprising: a candidate address generator to randomly select candidate addresses from a set of addresses; a repeat address detector to determine whether, before all of the addresses from the set of addresses have been output, a candidate address has already been output at least one time; and, an output selector to output the candidate address if the candidate address has not already been output at least one time and to, if the candidate address has already been output at least one time, select from the set of addresses and output a different address that has not already been output at least one time.

Example 2. The address generation circuit of example 1, further comprising: a set of indicators corresponding to respective ones of the set of addresses, the set of indicators corresponding to whether the respective ones of the set of addresses have already been output at least one time.

Example 3: The address generation circuit of example 2, further comprising: an indicator updater to, when an address is output, alter a value of a corresponding one of the set of indicators.

Example 4: The address generation circuit of example 2, wherein the different address is selected based at least in part on the set of indicators.

Example 5: The address generation circuit of example 1, wherein the candidate addresses are selected based on values from a random number generator.

Example 6: The address generation circuit of example 5, wherein the different address is selected based at least in part on a value from the random number generator.

Example 7. The address generation circuit of example 1, wherein the candidate address is to be used to address a non-volatile memory.

Example 8: A method of outputting a set of access addresses, comprising: selecting, based at least in part on a randomly generated number, a first address from the set of access addresses; determining whether the first address has been output before all of the other addresses in the set of access addresses have been output; if the first address has not already been output before all of the other addresses in the set of access addresses have been output, outputting the first address; and, if the first address has already been output before all of the other addresses in the set of access addresses have been output, selecting a second address that has not already been output before all of the other addresses in the set of access addresses have been output and outputting the second address.

Example 9: The method of example 8, further comprising: maintaining a set of indicators each corresponding to respective ones of the set of access addresses, the set of indicators associated with whether the respective ones of the set of access addresses have been output before all of the other addresses in the set of access addresses have been output.

Example 10: The method of example 8, further comprising: altering a value of a one of the set of indicators when an address corresponding to the one of the set of indicators is output.

Example 11: The method of example 8, wherein the second address is selected based at least in part on the set of indicators.

Example 12: The method of example 8, wherein the first address is selected based on at least one value from a random number generator.

Example 13: The method of example 12, wherein the different address is selected based at least in part on a value from the random number generator.

Example 14: The method of example 8, wherein the second address is to be used to address a non-volatile memory.

Example 15: A memory system, comprising: a memory to store sensitive data addressed by a set of N number of access addresses, where N is greater than four; and, an address generator to randomly and non-repetitively select ones of the set of N number of access addresses until all of the N number of access addresses have been used to address the memory.

Example 16: The memory system of example 15, wherein the address generator is to randomly select a first address from the set of N number of access addresses.

Example 17: The memory system of example 16, wherein the address generator is to determine whether the first address has been used to address the memory.

Example 18: The memory system of example 17, wherein the memory system is to, if the first address has not been used to address the memory, address the memory based at least in part on the first address.

Example 19: The memory system of example 18, wherein the memory system is to, if the first address has been used to address the memory, address the memory based at least in part on a second address.

Example 20: The memory system of example 18, wherein the memory system is to select the second address from a subset of the set of N number of access addresses that have not been used to address the memory.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory access circuit, comprising:
   a nonvolatile memory to store a secret block of data;
   a nonvolatile memory controller to receive requests to access the secret block of data and to output one time for each request, in different access patterns and to the nonvolatile memory, each of a set of addresses that address the secret block of data in the nonvolatile memory;
   a candidate address generator to randomly select candidate addresses from the set of addresses and provide the candidate addresses to an output selector;
   a repeat address detector to determine whether, before all of the addresses from the set of addresses have been provided to the nonvolatile memory controller in response to a request, a candidate address has already been output at least one time; and,
   the output selector to provide the candidate address to the nonvolatile memory controller if the candidate address has not already been provided to the nonvolatile memory controller in response to the request at least one time and to, if the candidate address has already been provided to the nonvolatile memory controller in response to the request at least one time, select from the set of addresses and provide a different address that has not already been provided to the nonvolatile memory controller in response to the request at least one time.

2. The memory access circuit of claim 1, further comprising:
   a set of indicators corresponding to respective ones of the set of addresses, the set of indicators corresponding to whether the respective ones of the set of addresses have already been provided to the nonvolatile memory controller in response to the request at least one time.

3. The memory access circuit of claim 2, further comprising:
   an indicator updater to, when an address is provided to the nonvolatile memory controller in response to the request, alter a value of a corresponding one of the set of indicators.

4. The memory access circuit of claim 2, wherein the different address is selected based at least in part on the set of indicators.

5. The memory access circuit of claim 1, wherein the candidate addresses are selected based on values from a random number generator.

6. The memory access circuit of claim 5, wherein the different address is selected based at least in part on a value from the random number generator.

7. The memory access circuit of claim 5, wherein the values from the random number generator index to the candidate addresses.

8. A method of providing randomized access patterns to a block of secret data, comprising:
   receiving a request to access the block of secret data;
   selecting, in response to the request and based at least in part on a first randomly generated number, a first address from a set of memory access addresses that address the block of secret data;
   providing, in response to the request, the first address to a nonvolatile memory controller;
   selecting, in response to the request and based at least in part on a second randomly generated number, a second address from the set of memory access addresses;
   determining whether the second address has been provided, to the nonvolatile memory controller in response to the request, before all of the other addresses in the set of memory access addresses have been provided to the nonvolatile memory controller in response to the request;
   if the second address has not already been provided to the nonvolatile memory controller in response to the request before all of the other addresses in the set of memory access addresses have been provided to the nonvolatile memory controller in response to the request, providing the second address to the nonvolatile memory controller; and,
   if the second address has already been provided to the nonvolatile memory controller in response to the request before all of the other addresses in the set of memory access addresses have been provided to the nonvolatile memory controller in response to the request, selecting a third address that has not already been provided to the nonvolatile memory controller in response to the request before all of the other addresses in the set of memory access addresses have been provided to the nonvolatile memory controller in response to the request and providing, to the nonvolatile memory controller, the third address.

9. The method of claim 8, further comprising:
   maintaining a set of indicators each corresponding to respective ones of the set of memory access addresses, the set of indicators associated with whether the respective ones of the set of memory access addresses have been provided to the nonvolatile memory controller in response to the request before all of the other addresses in the set of access addresses have been provided to the nonvolatile memory controller.

10. The method of claim 8, further comprising:
    altering a value of a one of the set of indicators when a memory access address corresponding to the one of the set of indicators is provided to the nonvolatile memory controller in response to the request.

11. The method of claim 8, wherein the third address is selected based at least in part on the set of indicators.

12. The method of claim 8, wherein the first address is selected based on at least one value from a random number generator.

13. The method of claim 12, wherein the third address is selected based at least in part on a value from the random number generator.

14. The method of claim 12, wherein values from the random number generator index to the first address and the second address and do not index to the third address.

* * * * *